US008050424B2

(12) United States Patent
Noro

(10) Patent No.: US 8,050,424 B2
(45) Date of Patent: Nov. 1, 2011

(54) SPEAKER SYSTEM, AUDIO AMPLIFIER AND AUDIO SYSTEM

(75) Inventor: Masao Noro, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1552 days.

(21) Appl. No.: 11/262,433

(22) Filed: Oct. 28, 2005

(65) Prior Publication Data

US 2006/0093158 A1 May 4, 2006

(30) Foreign Application Priority Data

Oct. 29, 2004 (JP) ................................ 2004-316185

(51) Int. Cl.
*H04R 1/40* (2006.01)
*H03G 5/00* (2006.01)

(52) U.S. Cl. ............................... 381/97; 381/98; 381/99

(58) Field of Classification Search .......... 381/1, 97–99, 381/338
See application file for complete search history.

(56) References Cited

U.S. PATENT DOCUMENTS 4,980,914 A * 12/1990 Kunugi et al. .................... 381/1
5,701,344 A * 12/1997 Wakui ................................ 381/1
5,781,642 A * 7/1998 Tanaka et al. ................. 381/345
7,292,697 B2 * 11/2007 Tatsuta et al. ................. 381/302

FOREIGN PATENT DOCUMENTS

CN 1325257 A 5/2001
JP 01-319792 12/1989
JP 2002-084592 3/2002

OTHER PUBLICATIONS

People's Republic of China, First Office Action for Application No. 200510118750.X (Dated: Dec. 5, 2008).
Japanese Patent Office ("Notification of Reason for Refusal"), Application No. 2004-316185, dated Sep. 18, 2007 (2 pgs.).
Japananese Patent Office, "Notice of Reason for Rejection," 2004-316185; dated Sep. 12, 2007; 2 pages.

* cited by examiner

*Primary Examiner* — Devona Faulk
*Assistant Examiner* — George Monikang
(74) *Attorney, Agent, or Firm* — Pillsbury Winthrop Shaw Pittman LLP

(57) ABSTRACT

Speaker system is constructed of a plurality of speakers each including a bass-reflex type cabinet. The speaker system is designed to differentiate a low-band resonance frequency between the speakers by differentiating inner cubic capacities of the speaker cabinets from each other. Audio signal of a different channel is input to each of the speakers, and only low-frequency signals of all of the channels are added together so that the added result is supplied to all of the speakers. Thus, using the differentiated low-band resonance frequencies, the speaker system permits reproduction of low-pitched sounds with a flat characteristic.

8 Claims, 8 Drawing Sheets

SPEAKER SYSTEM, AUDIO AMPLIFIER AND AUDIO SYSTEM

BACKGROUND OF THE INVENTION

The present invention relates to an improved speaker system and audio system which allow a low-pitched sound to be output with a flat characteristic.

In the field of speakers including a speaker unit housed in a cabinet (commonly called "speaker systems"), there have been proposed various internal structures (so-called "enclosures") of the cabinets which, in order to enhance a low-pitched-sound reproduction efficiency, can not only lower a low-band resonance frequency f0 of the speaker unit itself but also allow low-pitched sounds to be output in an accentuated fashion. One example of such internal structures of the speaker cabinets is proposed in "Encyclopedia of Speaker & Enclosure" published in 1999 by Seibundo Shinko Sha under editorial supervision by Saeki Tamon.

FIGS. 1A-1C are views showing examples of interior structures of speaker cabinets. Specifically, FIG. 1A shows the interior structure of a bass-reflex type cabinet, which has a cylindrical opening (bass reflex port) in the same plane as the speaker. This interior structure permits accentuated output of a low-pitched sound, taking advantage of the phenomenon that air within the cabinet and air within the bass reflex port resonate with each other at a particular frequency through the Helmholtz resonance. The resonance frequency fr can be expressed by $$fr=\sqrt{(S/P)}/2\pi$$

, where S represents an inner cubic capacity of the cabinet and P represents an inner cubic capacity of the port.

Low-frequency reproduction characteristic of the speaker can be improved by designing the resonant frequency fr to be slightly lower than the low-band resonance frequency f0 of the speaker unit.

Further, FIG. 1B is a view showing the interior structure of a "quarter tube" cabinet. The quarter tube serves to accentuate a low-pitched sound through tube resonance, and a resonance tube (closed tube) having a length h is formed by a partition plate provided on the rear surface of the speaker. Lowest resonance frequency Fr can be expressed by Fr=M/4h (where M represents the sound speed). Further, FIG. 1C a view showing the interior structure of a "transmission line" cabinet that takes advantage of the tube resonance and the Helmholtz resonance.

With each of the aforementioned cabinet structures, it is possible to accentuate low-pitched sounds through resonance; however, because only one low-band resonance frequency is permitted in the speaker unit and enclosure, the resonance action can be utilized only in a very narrow frequency band range. Thus, the bass-reflex type cabinet can present a characteristic as illustrated in FIG. 2A. Particularly, where the cabinet is designed to achieve strong resonance, however, balance in frequency characteristic between the speaker unit and the bass reflex port would be lost as seen in FIG. 2B, which would often make it difficult to obtain a flat characteristic over a wide low frequency band range.

SUMMARY OF THE INVENTION

In view of the foregoing, it is an object of the present invention to provide a technique for permitting reproduction of a low-pitched sound with a flat characteristic using a resonance-type cabinet structure.

In order to accomplish the above-mentioned object, the present invention provides an improved speaker system, which comprises a plurality of speakers, each of the speakers including a cabinet having a resonance frequency in a low band range and a speaker unit housed in the cabinet, and in which the resonance frequency is differentiated between the cabinets of individual ones of the plurality of speakers.

According to another aspect of the present invention, there is provided an audio amplifier for inputting and amplifying audio signals of a plurality of channels to thereby output amplified audio signals, which comprises: a signal separation section that separates the audio signal of each of the plurality of channels into a low-frequency signal and high-frequency signal and adds together the low-frequency signals of the individual channels; a phase shift section that shifts the respective phases of the low-frequency signals of the plurality of channels, separated by the signal separation section, with a characteristic differing between the plurality of channels; an addition section that, for each of the plurality of channels, adds together the low-frequency signal phase-shifted by the phase shift section and the high-frequency signal of the channel separated by the signal separation section, to thereby provide an added signal for that channel; and an amplification section that amplifies the added signal provided by the adder section for each of the plurality of channels and supplies the amplified added signal to a corresponding speaker.

According to still another aspect of the present invention, there is provided an audio system comprising the speakers recited in claim 1 connected to the amplification section of the audio amplifier recited in claim 2.

In the audio system, it is preferable that, for each of the plurality of channels, the phase shift section shifts the low-frequency signal with a characteristic corresponding to a combination of respective phase characteristics of the cabinets of the speakers connected to the other channels than the channel in question.

Namely, in the present invention, there are employed a plurality of speakers each including a speaker unit housed in a resonance-type cabinet, and the resonance frequency is differentiated between the cabinets of the individual speakers. With such arrangements, the low-band frequency to be accentuated is caused to differ between the speakers, so that a flat low-frequency reproduction characteristic can be achieved over a wide frequency band range by simultaneous operation of the speakers.

Generally, a low-pitched sound output from a resonance-type cabinet is inverted in phase with a resonance frequency of the cabinet functioning as a cutoff frequency. Because the cabinet's resonance frequency differs between the speakers, the frequency at which the phase of a low-pitched sound to be output is inverted also differs between the speakers. Thus, there will occur a frequency band range where sounds output from the speakers assume opposite phases, e.g. where a sound output from one of the speakers has been inverted in phase while a sound output from another one of the speakers has not been inverted in phase. If a same signal is input to these speakers to output sounds from the speakers, the frequency band range that introduces such an opposite-phase state will produce an undesired condition (i.e., "dip" in the frequency characteristic) where the sounds output from the speakers cancel out each other.

To avoid the above-mentioned inconveniences, the present invention is arranged to shift respective phases of low-frequency signals to be input to the individual speakers and thereby prevent sounds from assuming opposite phases, even in the above-mentioned frequency band range causing an opposite-phase state, because the phases have been shifted in advance according to the invention. In this way, the present invention can avoid an undesired dip in the frequency characteristic.

Particularly, in the present invention, the low-frequency signal is shifted, for each of the plurality of channels, with a characteristic corresponding to a combination of phase characteristics of the cabinets of the speakers connected to the other channels than the channel in question (e.g., in the case of a 2-channel system, with a characteristic of the other channel, or in the case of a 5-channel system, with a characteristic corresponding to a combination of phase characteristics of the other four channels). In this way, the present invention allows low-frequency signals of all of the channels to agree with each other in phase and can thereby accentuate a low-pitched sound with no loss.

Namely, according to the present invention, it is possible to achieve a flat frequency characteristic over a wide low frequency band range by employing a plurality of speakers each with a resonance-type cabinet and differentiating the low-band resonance frequency between these speakers.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the objects and other features of the present invention, its preferred embodiments will be described hereinbelow in greater detail with reference to the accompanying drawings, in which.

DETAILED DESCRIPTION OF THE INVENTION

Figure 1A:
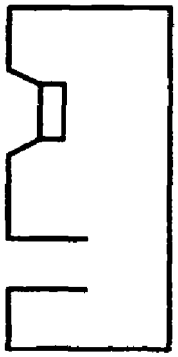
FIGS. 1A-1C are views showing examples of resonance-type speaker cabinets.
Figure 1B:
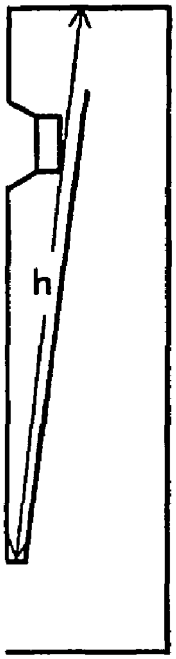
Figure 1C:
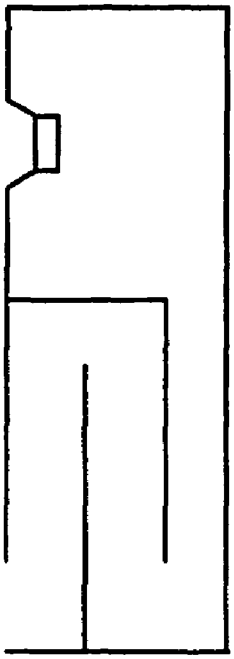
Figure 2A:
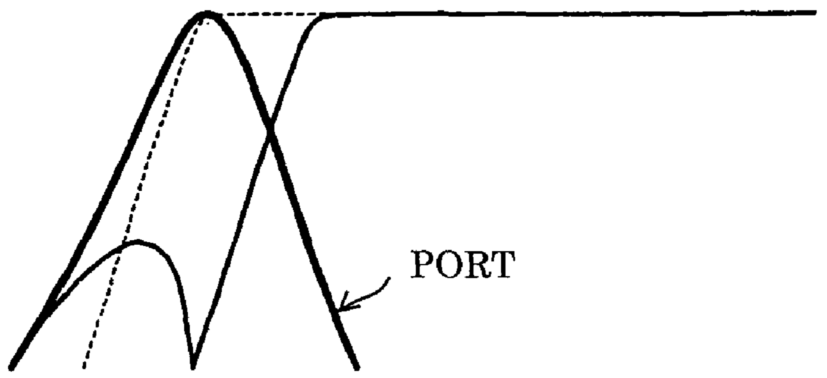
FIGS. 2A and 2B are diagrams showing frequency characteristics of a bass-reflex type speaker.
Figure 2B:
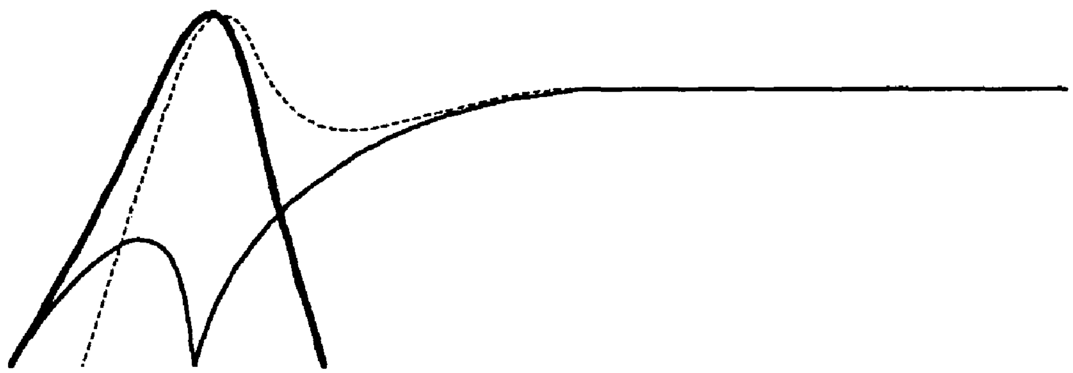
Figure 3A:
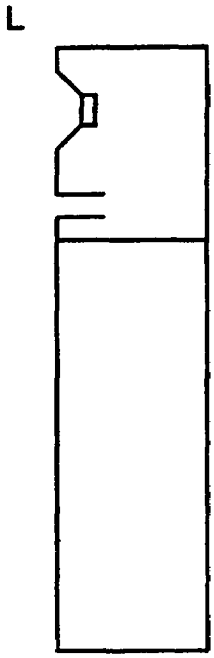
FIGS. 3A and 3B are views of 2-channel and 5-channel speaker systems according to embodiments of the present invention.
Figure 3B:
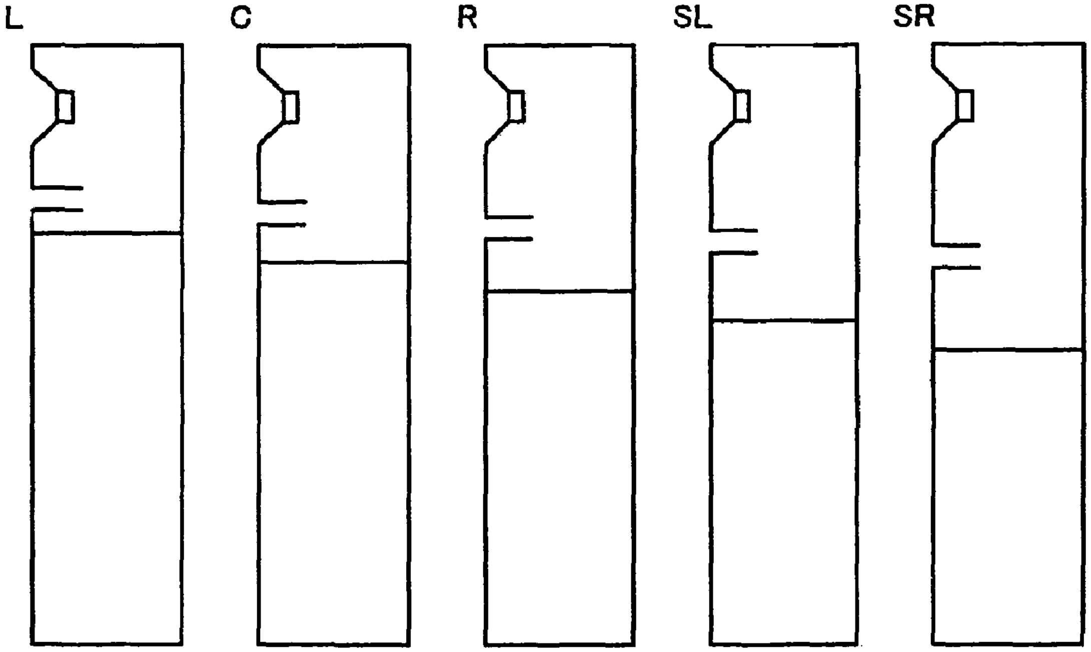

FIGS. 3A and 3B are views of speaker systems according to embodiments of the present invention. In each of FIGS. 3A and 3B, one speaker system comprises a plurality of full-range speakers. In this specification, a plurality of speaker units (tweeter, woofer, etc.) housed in a single cabinet will be referred to simply as a "speaker" and a combination or set of a plurality of such speakers will be referred to as a "speaker system", whereas such a plurality of speaker units housed in a single cabinet are conventionally called a "speaker system".

Specifically, FIG. 3A shows a speaker system for stereo two channels or virtual-surround two channels, where one of the speakers is for the left (L) channel while the other speaker is for the right (R) channel. FIG. 3B shows a 5.1-channel surround speaker system, which comprises speakers for the left (L) channel, center (C) channel, right (R) channel, surround left (SL) channel, surround right (SR) channel. Where such a 5.1-channel surround speaker set is used, no subwoofer is employed.

As shown in FIG. 3A or FIG. 3B, each of the speakers is constructed as a "tall-type" structure having a vertically-long casing that functions both as a cabinet (i.e., speaker box or enclosure) and as a stand. In each of the speaker systems shown in FIG. 3A and FIG. 3B, the cabinet section in each of the speakers has a different length and the remaining section, i.e. the stand section, has a different length; namely, the length of the cabinet section is differentiated between (among) the speakers. Further, in each of the speakers, the cabinet section is of a "bass-reflex" type where a bass reflex port 5 is formed in the same plane as the speaker unit 4.

Thus-applying the present invention to the "tall-type" speakers allows the stand sections to be used efficiently.

In the case of the conventionally-known bass reflex cabinets, a low-band resonance frequency is determined by the inner cubic capacity of the cabinet 2 and inner cubic capacity of the bass reflex port 5. However, in the inventive speaker system of FIG. 3A, the low-band resonance frequencies of the left and right channel cabinets 2L and 2R are differentiated from each other by differentiating sizes of the left and right channel cabinets 2L and 2R from each other. For example, the low-band resonance frequency of the left channel cabinet 2L is set at 30 Hz, while the low-band resonance frequency of the right channel cabinet 2R is set at 50 Hz.

In the 5-channel speaker system of FIG. 3B as well, the low-band resonance frequencies of the cabinets of the individual speakers are differentiated from one another by differentiating sizes of these cabinets.

Namely, by differentiating the low-band resonance frequency among the speaker cabinets, the present invention can differentiate frequency characteristics of the individual speakers, i.e. low-band resonance frequencies to be accentuated in the individual speaker cabinets. By combining the thus-differentiated frequency characteristics, the present invention can achieve a flat frequency characteristic over an entire low band range.

The benefit of the flat frequency characteristic can be accomplished in the above-described manner, in the case where the individual speakers are connected to different channels. In an alternative, low-frequency signals of all of the channels can be output with a flat frequency characteristic by combining only low-frequency signals of audio signals of the individual channels into a monaural low-frequency signal and then adding the monaural low-frequency signal to the individual channels. In this alternative, combining the low-band signals of the audio signals of the individual channels into a monaural low-frequency signal will not have a substantial adverse effect. This is because the human auditory sense generally feels sound image localization with high-pitched sounds, hardly feeling sound image localization with low-pitched sounds. Thus, as long as high-pitched sounds are appropriately localization-controlled in the plurality of channels, the human auditory sense can feel normal sound image localization even though low-frequency signals are combined into a monaural low-frequency signal.

Whereas the embodiments have been shown and described as employing the cabinets of the bass-reflex type taking advantage of the Helmholtz resonance, the present invention may employ cabinets of any other resonance-based construction, such as a quarter tube construction or transmission line construction.

In the case where the speaker system of the present invention is employed, and if phases of low-pitched sounds output from the bass reflex ports 5 can be ignored (e.g., if the individual speakers are oriented randomly, if a barrier wall is provided between the bass reflex port of each of the speakers and a listener, or the like), low-pitched sounds accentuated with a flat characteristic can be reproduced with the speaker system connected to an ordinary audio amplifier.

However, in an ordinary form of installation, where all of the speakers are oriented toward a predetermined listening point, the phases of low-pitched sounds output from the bass reflex ports 5 of the individual speakers do matter.

Next, a description will be given about the speaker system of two channels in order to simplify the explanation.

Figure 4A:
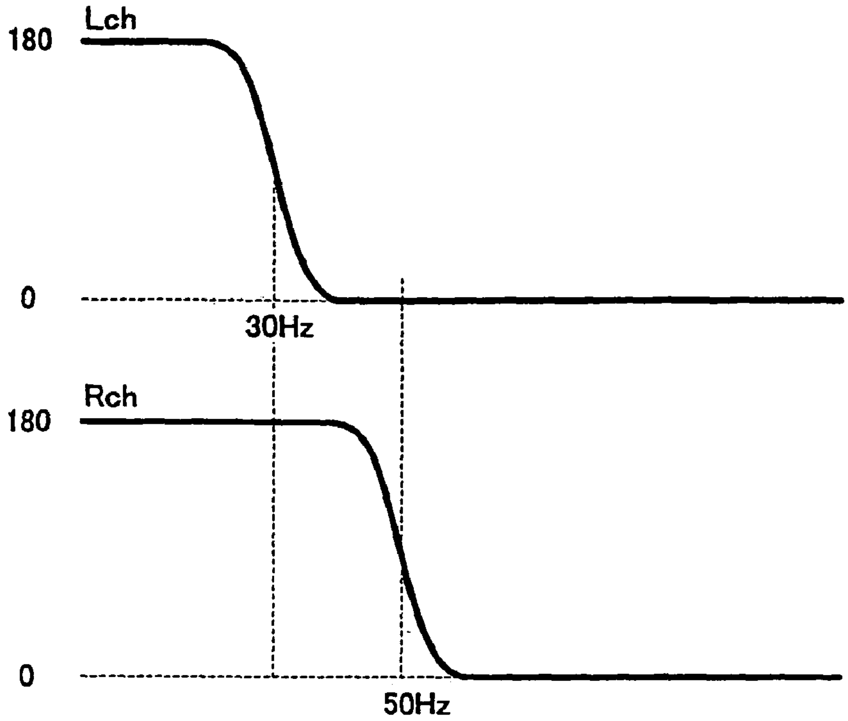
FIGS. 4A and 4B are diagrams showing phase and frequency characteristics of the speaker systems of FIGS. 3A and 3B.

In the case of a bass-reflex type speaker, a sound output from each of the bass reflex ports 5 is inverted in phase at or around the low-band resonance frequency, as shown in FIG. 4A. Specifically, in the 2-channel speaker system of FIG. 3A, the phase of a sound output from the speaker 1L of the left channel is inverted with 30 Hz as a cutoff frequency, while the phase of a sound output from the speaker 1R of the right channel is inverted with 50 Hz as a cutoff frequency. Thus, sounds of frequency bands in the range of 30 Hz-50 Hz are output in opposite phases from the respective bass reflex ports 5L and 5R of the two speakers 1L and 1R. If a same low-frequency signal in the above-mentioned frequency band range is input to the left and right channels, sounds of completely opposite phases are transmitted to the listening point to cancel out each other, so that sounds in the above-mentioned frequency band range will be undesirably lost. Consequently, the speaker system can not present a characteristic corresponding to an added result of the frequency characteristics of the individual speakers, so that there would be produced an undesired “dip” in the above-mentioned frequency band.

If low-frequency signals of audio signals of a plurality of channels are added together and the resultant sum or added signal is re-input to the individual channels, then the low-frequency signals of the individual channels will become completely identical to each other and thereby cancel out each other due to the opposite phases as set forth above. Even where a separate audio signal is input to each of the channels independently of each other, canceling-out of low-frequency signals will occur as noted above although the speaker system can achieve a flat characteristic as a whole, because the low-frequency signals of the individual channels are often similar to each other.

Thus, an audio amplifier to be described below is constructed in such a manner as to prevent sounds of completely opposite phases from being output in any frequency band range by differentiating phases of low-frequency signals to be input to individual speakers.

Figure 5:
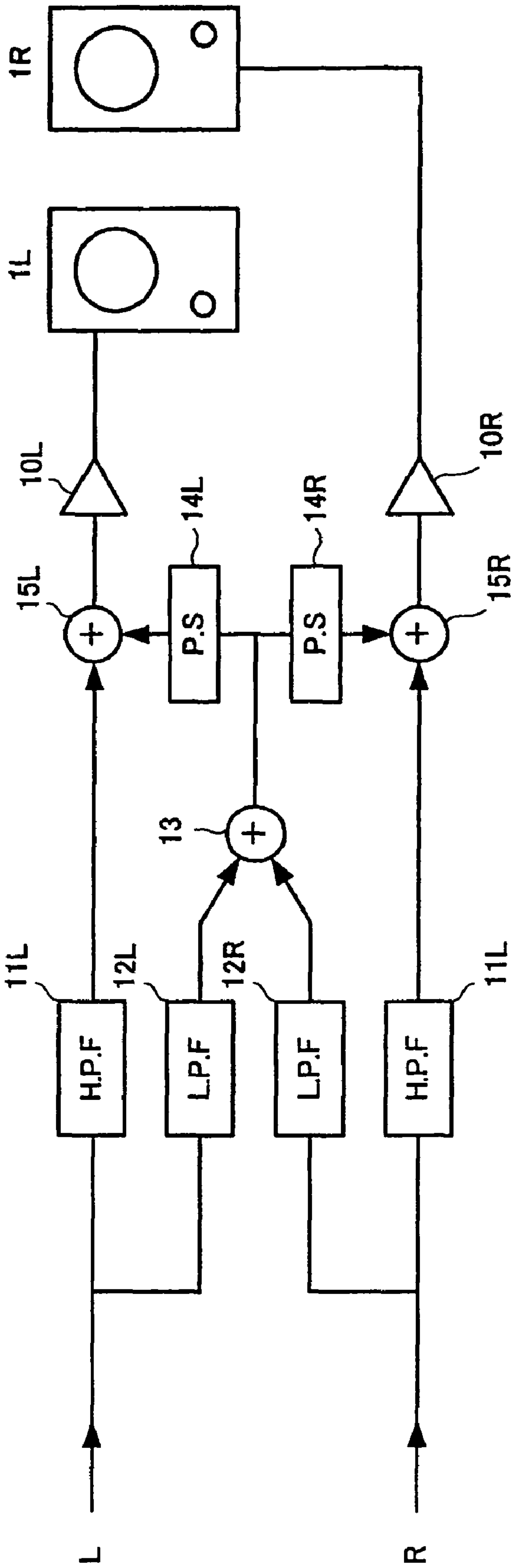
FIG. 5 is a block diagram of a 2-channel audio amplifier to which is connected the 2-channel speaker system of FIG. 3A.

FIG. 5 is a block diagram of the audio amplifier to which is connected the 2-channel speaker system of FIG. 3A, which is an amplifier for stereo two channels. The speakers 1L and 1R are driven by respective power amplifiers 10L and 10R. To the power amplifier 10L are input a high-frequency signal of the L channel and an added result of low-frequency signals of the L channel and R channel. To the power amplifier 10R are input a high-frequency signal of the R channel and added result of low-frequency signals of the L channel and R channel. Namely, the L-channel speaker 1L reproductively outputs the high-frequency signal of the L channel and added result of the low-frequency signals of the L channel and R channel, while the R-channel speaker 1R reproductively outputs the high-frequency signal of the R channel and added result of the low-frequency signals of the L channel and R channel.

Audio signal of the L channel is input to a high-pass filter (HPF) 11L and low-pass filter (LPF) 12L so that it is divided or separated into a high-frequency signal and low-frequency signal. Similarly, an audio signal of the R channel is input to a high-pass filter (HPF) 11R and low-pass filter (LPF) 12R so that it is separated into a high-frequency signal and low-frequency signal. Crossover frequency between the high-pass filters 11L, 11R and the low-pass filters 12L, 12R is set at about 150 Hz.

The high-frequency signal having been passed through the high-pass filter 11L is delivered via an addition circuit 15L to the power amplifier 10L, and the high-frequency signal having been passed through the high-pass filter 11R is delivered via an addition circuit 15R to the power amplifier 10R.

The low-frequency signal having been passed through the low-pass filter 12L and the low-frequency signal having been passed through the low-pass filter 12R are added together by an addition circuit 13. Therefore, the addition circuit 13 outputs a low-frequency signal converted into monaural form.

The converted monaural low-frequency signal is then shifted in phase by phase shifters 14L and 14R. The low-frequency signal phase-shifted by the phase shifter 14L is delivered via the addition circuit 15L to the power amplifier 10L, while the low-frequency signal phase-shifted by the phase shifter 14R is delivered via the addition circuit 15R to the power amplifier 10R.

The phase shifters 14L and 14R may each be in the form of an all-pass filter. The L-channel phase shifter 14L is designed to rotate the signal phase with a same phase characteristic (cutoff frequency) as the bass-reflex cabinet 2R of the R-channel speaker 1R, while the R-channel phase shifter 14R is designed to rotate the signal phase with a same phase characteristic (cutoff frequency) as the bass reflex cabinet 2L of the L-channel speaker 1L.

Figure 6:
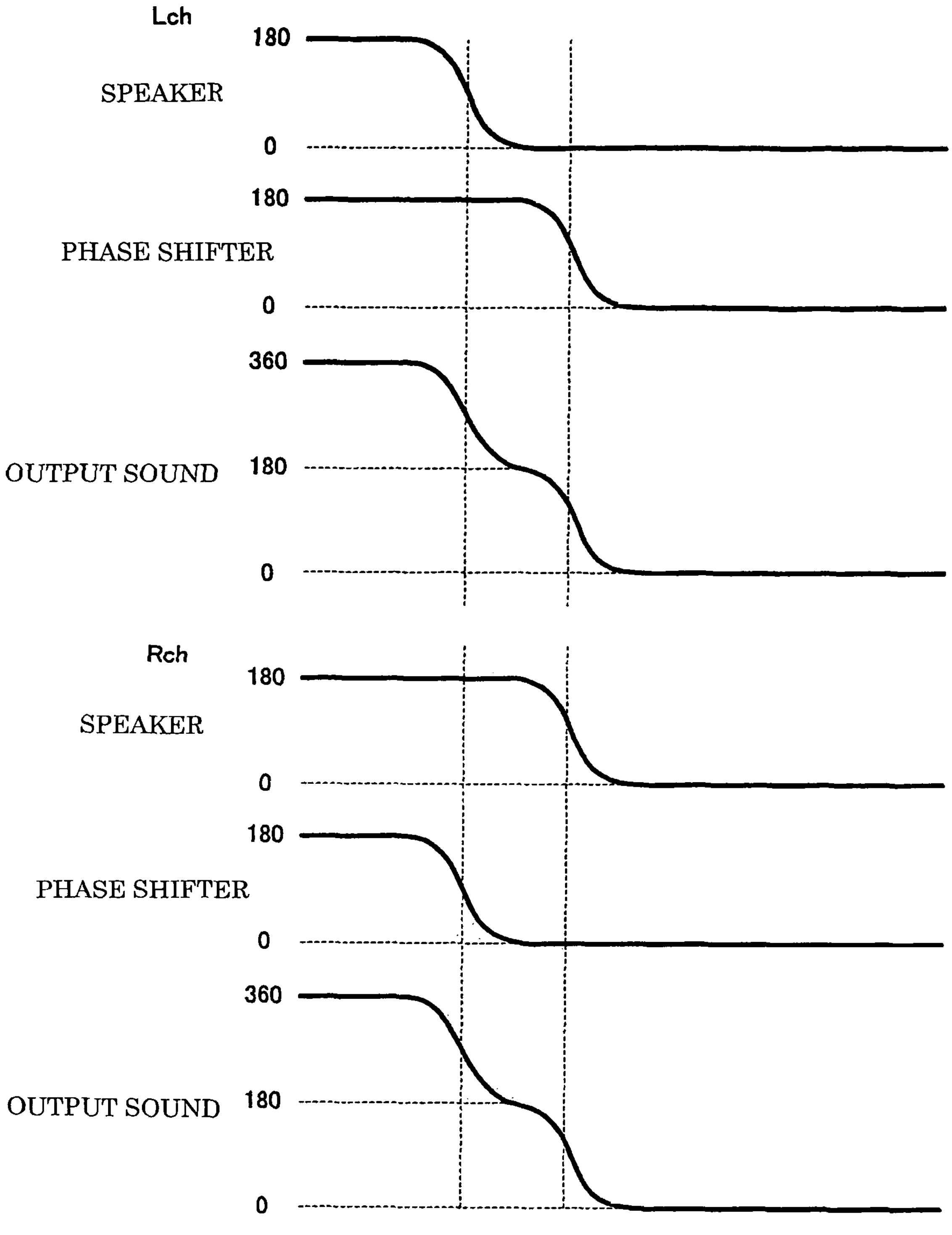
FIG. 6 is a diagram explanatory of phase characteristics of low-frequency signals in the audio amplifier of FIG. 5.

With the L- and R-channel phase shifters 14L and 14R designed in the aforementioned manner, as shown in FIG. 6, the L-channel low-frequency signal is phase-shifted in accordance with the phase characteristic of the R-channel bass-reflex cabinet, while the R-channel low-frequency signal is phase-shifted in accordance with the phase characteristic of the L-channel bass-reflex cabinet. Then, the L-channel low-frequency signal is phase-shifted in accordance with the phase characteristic of the L-channel bass-reflex cabinet while the R-channel low-frequency signal is phase-shifted in accordance with the phase characteristic of the R-channel bass-reflex cabinet, so that the low-frequency signals output from the left and right speakers are allowed to completely agree in phase and thus will not cancel out each other. Therefore, a characteristic corresponding to an added signal of the frequency characteristics of the individual speakers (each including the speaker unit and bass reflex port) becomes a frequency characteristic of the entire speaker system, and thus, even where the speakers of the individual channels are oriented toward the listening point, it is possible to achieve a flat low-frequency reproduction characteristic.

Figure 4B:
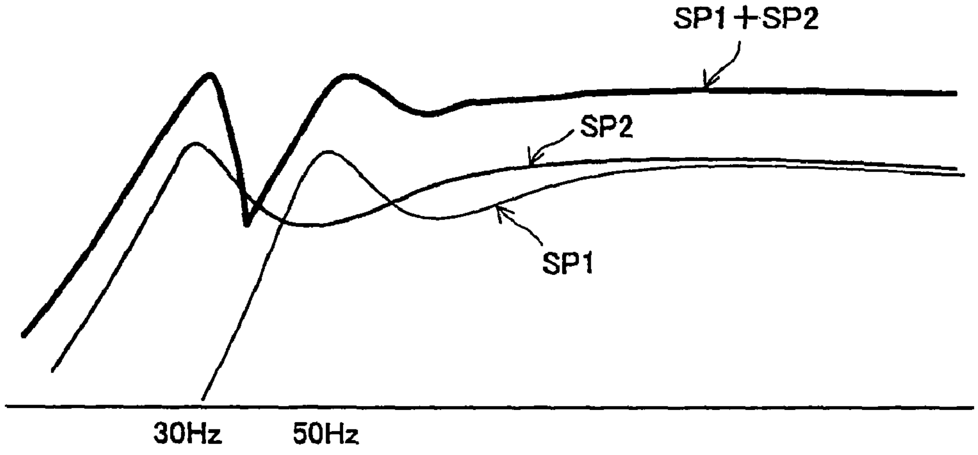

Whereas the embodiments have been described in relation to an ideal case where the phases of the left and right channels are adjusted to completely agree with each other, a dip in the frequency characteristic as illustratively shown in FIG. 4 can be avoided by just rotating the signal of any one of the channels to the extent that sounds output from the bass reflex ports of the individual speakers do not assume completely opposite phases.

Figure 7:
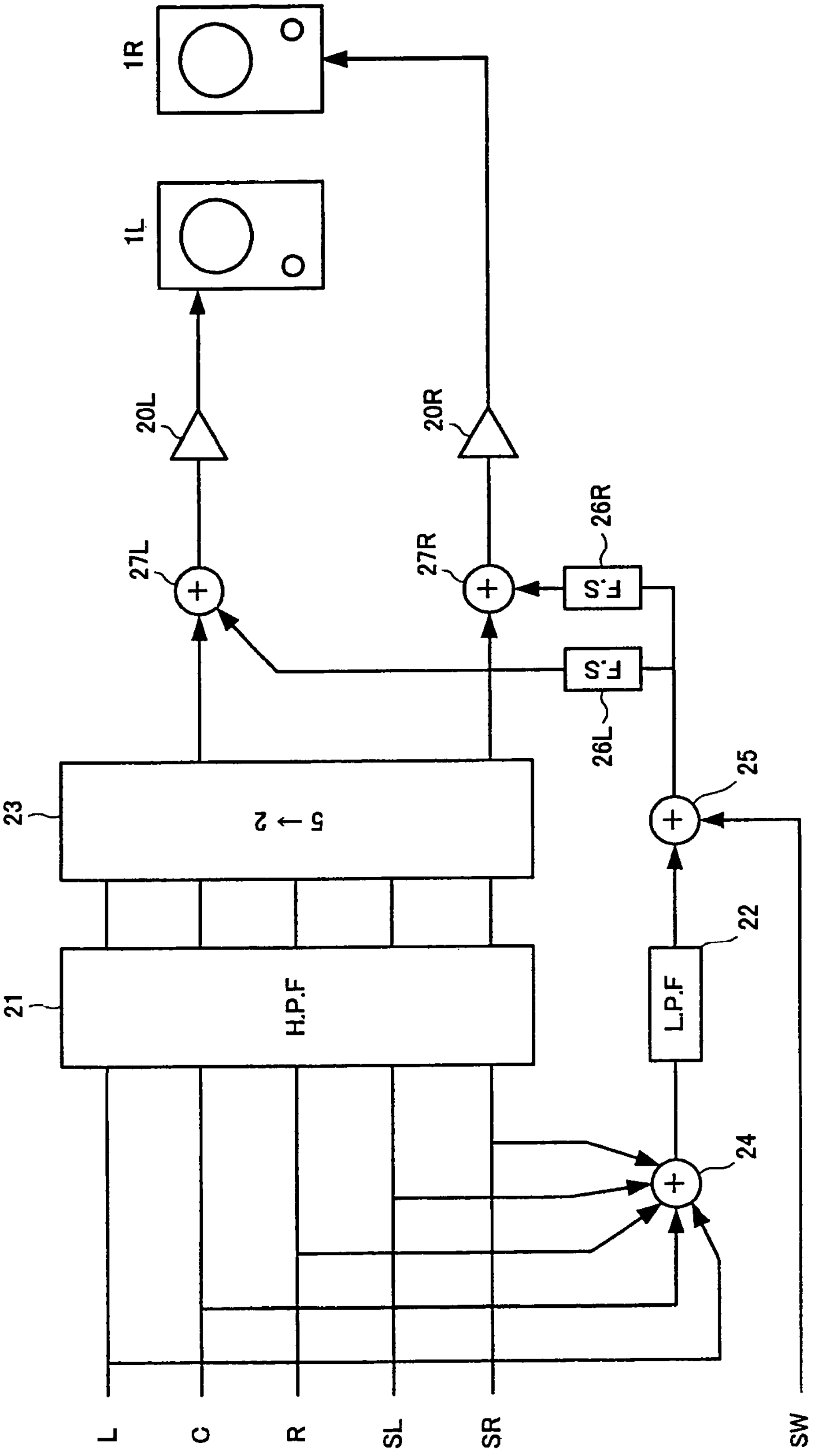
FIG. 7 is a block diagram of a virtual surround audio amplifier to which is connected the 2-channel speaker system of FIG. 3A.

FIG. 7 is a block diagram of a virtual surround audio amplifier to which is connected the 2-channel speaker system of FIG. 3A. This virtual surround audio amplifier is designed to extract low-frequency signals from audio signals of five channels and add together the extracted low-frequency signals and subwoofer signal to supply the addition result (added signal) to the speakers.

Signals from the left (L), center (C), right (R) channel, surround-left (SL) and surround (SR) channels of the 5.1 channels are input to a high-pass filter 21 and also added together via an addition circuit 24, after which the added signal of the signals is delivered to a low-pass filter 22. The high-pass filter 21 filters high-frequency signals on the channel-by-channel basis. Crossover frequency between the high-pass filter 21 and the low-pass filter 22 is set at about 150 Hz.

The thus-filtered signals from the high-pass filter 21 are passed to a virtual surround circuit 23 and are combined with the signals of the L and R channels. The high-frequency signal of the left channel is delivered via an addition circuit 27L to a power amplifier 20L. The high-frequency signal of the right channel is delivered via an addition circuit 27R to a power amplifier 20R.

Low-frequency signals of the five channels filtered by the low-pass filter 22 are input to an addition circuit 25 to which is also input a signal of the subwoofer (SW) channel. Signal (low-frequency signal) obtained by the addition circuit 25 adding together the input signals is supplied to phase shifters 26L and 26R. Similarly to the above-described phase shifters 14L and 14R of FIG. 5, the phase shifters 26L and 26R each comprise an all-pass filter, and the L-channel phase shifter 26L is designed to rotate the signal phase with a same phase characteristic (cutoff frequency) as the bass-reflex cabinet 2R of the R-channel speaker 1R, while the R-channel phase shifter 26R is designed to rotate the signal phase with a same phase characteristic (cutoff frequency) as the bass reflex-cabinet 2L of the L-channel speaker 1L.

In the above-described manner, low-pitched sounds output from the left and right speakers 1L and 1R can completely agree with each other in phase, so that the speaker system can achieve a flat low-frequency characteristic as a whole.

Figure 8:
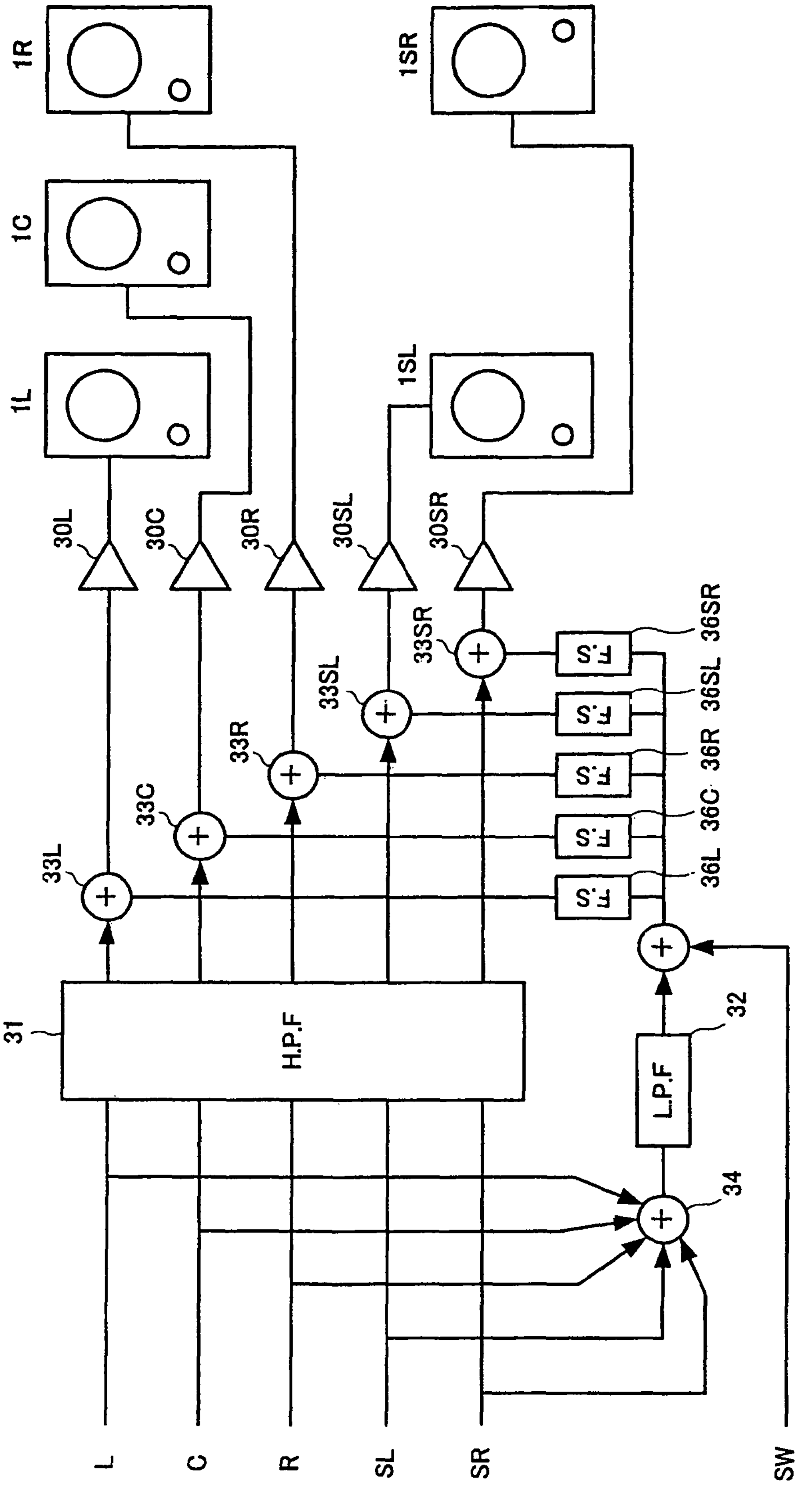
FIG. 8 is a block diagram of a surround audio amplifier to which is connected the 5-channel speaker system of FIG. 3B.

FIG. 8 is a block diagram of a surround audio amplifier to which is connected the 5-channel speaker system of FIG. 3B. This virtual surround audio amplifier is designed to extract low-frequency signals from audio signals of the five channels and add together the extracted low-frequency signals and subwoofer signal to supply the addition result to the individual speakers.

Signals from the left (L), center (C), right (R) channel, surround-left (SL) and surround (SR) channels of the 5.1 channels are input to a high-pass filter 31 and also added together via an addition circuit 34, after which the added result of the signals is delivered to a low-pass filter 32. The high-pass filter 31 filters high-frequency signals on the channel-by-channel basis. Crossover frequency between the high-pass filter 31 and the low-pass filter 32 is set at about 150 Hz.

The thus-filtered signals from the high-pass filter 31 are supplied, via addition circuits 33L, 33C, 33R, 33SL and 33SR, to power amplifiers 30L, 30C, 30R, 30SL and 33SR of the corresponding channels. Speakers 1L, 1C, 1R, 1SL and 1SR of the five channels are coupled to the power amplifiers 30L, 30C, 30R, 30SL and 33SR, respectively.

Low-frequency signals of the five channels filtered by the low-pass filter 32 are input to an addition circuit 35 to which is also input a signal of the subwoofer (SW) channel. Signal (low-frequency signal) obtained by the addition circuit 35 adding together the input signals is supplied to phase shifters 36L, 36C, 36R, 36SL and 36SR.

The phase shifters 36L, 36C, 36R, 36SL and 36SR comprise a plurality of stages of all-pass filters, and each of the phase shifters 36L, 36C, 36R, 36SL and 36SR is designed to rotate the signal phase with a phase characteristic corresponding to a combination of respective phase characteristics of the speakers (bass reflex cabinets) of the other four channels.

Namely, the speakers 1L, 1C, 1R, 1SL and 1SR differ from one another in inner cubic capacity of the cabinets as illustrated in FIG. 3B and hence differ from one another in low-band resonance frequency. Therefore, the sound output from each of the bass reflex ports is inverted in phase with the low-band resonance frequency as a cutoff frequency. The phase shifter 36L has a characteristic corresponding to the added result of the phase characteristics of the speakers 1C, 1R, 1SL and 1SR of the other channels. Similarly, each of the other phase shifters 36C, 36R, 36SL and 36SR has a characteristic corresponding to the added result of the phase characteristics of the bass-reflex cabinets of the speakers of the other channels.

The low-frequency signals phase-shifted by the 36L, 36C, 36R, 36SL and 36SR are supplied, via the addition circuits 33L, 33C, 33R, 33SL and 33SR, to the power amplifiers 30L, 30C, 30R, 30SL and 33SR of the corresponding channels.

In the above-described manner, low-pitched sounds output from the speakers 1L, 1C, 1R, 1SL and 1SR of the individual channels can completely agree in phase with one another, so that the speaker system can achieve a flat low-frequency characteristic as a whole.

Whereas the embodiments have been described as differentiating the low-band frequencies of the speaker cabinets by differentiating the inner cubic capacities of the speaker cabinets, the low-band frequencies of the speaker cabinets may be differentiated from one another by differentiating the inner cubic capacities of the individual bass reflect ports. In another alternative, the low-band frequencies of the speaker cabinets may be differentiated by differentiating the inner cubic capacities of both the speaker cabinets and the bass reflect ports.

What is claimed is:

1. An audio system comprising:

a plurality of speakers, each speaker of said plurality of speakers including a cabinet having a resonance frequency in a low band range and a speaker unit housed in said cabinet, wherein the resonance frequency is differentiated between said cabinets of individual ones of said plurality of speakers; and an audio amplifier for inputting and amplifying audio signals of a plurality of channels to output amplified audio signals, the audio amplifier including:

a signal separation section that separates the audio signal of each of the plurality of channels into a low-frequency signal relative to a crossover frequency between high-pass filters and low-pass filters and a high-frequency signal relative to the crossover frequency between the high-pass filters and low-pass filters and adds together the low-frequency signals of individual ones of the plurality of channels;

a phase shift section that shifts respective phases of the low-frequency signals of the plurality of channels, separated by said signal separation section, with a characteristic differing between the plurality of channels;

an addition section that, for each of the plurality of channels, adds together the low-frequency signal phase-shifted by said phase shift section and the high-frequency signal of the channel separated by said signal separation section, to thereby provide an added signal for the channel; and an amplification section coupled to each speaker of the plurality of speakers that amplifies the added signal provided by the addition section for each of the plurality of channels and supplies an amplified added signal to the corresponding speaker of the plurality of speakers, wherein, for each of the plurality of channels, the phase shift section shifts the low-frequency signal with a characteristic corresponding to a combination of phase characteristics of the cabinets of the speakers connected to individual ones of the channels other than said channel.

2. The audio system as claimed in claim 1, wherein the phase shift section shifts the phase of the respective low-frequency signals by rotating the phase at a frequency which is the same as a combination of the resonance frequencies of the cabinets of the speakers connected to individual ones of the channels other than said channel.

3. The audio system as claimed in claim 1, wherein the audio system includes two speakers and the audio amplifier outputs two corresponding channels.

4. The audio system as claimed in claim 1, wherein the audio system includes five speakers and the audio amplifier outputs five corresponding channels.

5. An audio system comprising:

a plurality of speakers, each of said speakers including a cabinet having a resonance frequency in a low band range and a speaker unit housed in said cabinet, wherein the resonance frequency is differentiated between said cabinets of individual ones of said plurality of speakers; and an audio amplifier for inputting and amplifying audio signals of a plurality of channels to output amplified audio signals, the audio amplifier including:

signal separation means for separating the audio signal of each of the plurality of channels into a low-frequency signal relative to a crossover frequency between high-pass filters and low-pass filters and a high-frequency signal relative to the crossover frequency between the high-pass filters and low-pass filters and adding together the low-frequency signals of individual ones of the plurality of channels;

phase shifting means for shifting respective phases of the low-frequency signals of the plurality of channels, separated by said signal separation means, with a characteristic differing between the plurality of channels;

adding means for, for each of the plurality of channels, adding together the low-frequency signal phase-shifted by said phase shifting means and the high-frequency signal of the channel separated by said signal separation section, to thereby provide an added signal for the channel; and an amplification section coupled to each speaker of the plurality of speakers that amplifies the added signal provided by the addition section for each of the plurality of channels and supplies an amplified added signal to the corresponding speaker of the plurality of speakers, wherein, for each of the plurality of channels, the phase shifting means shifts the low-frequency signal with a characteristic corresponding to a combination of phase characteristics of the cabinets of the speakers connected to individual ones of the channels other than said channel.

6. The audio system as claimed in claim 5, wherein the phase shifting means shifts the phase of the respective low-frequency signals by rotating the phase at a frequency which is the same as a combination of the resonance frequencies of the cabinets of the speakers connected to individual ones of the channels other than said channel.

7. The audio system as claimed in claim 5, wherein the audio system includes two speakers and the audio amplifier outputs two corresponding channels.

8. The audio system as claimed in claim 5, wherein the audio system includes five speakers and the audio amplifier outputs five corresponding channels.

* * * * *